(12) United States Patent
Kim et al.

(10) Patent No.: US 8,415,877 B2
(45) Date of Patent: Apr. 9, 2013

(54) OLED DEVICE HAVING REAR ELECTRODES

(75) Inventors: Kwang Bok Kim, Seoul (KR); Tae Hyun Ban, Daegu (KR); Hwe Geun Kim, Gyeonggi-do (KR)

(73) Assignee: Kumho Electric, Inc., Seoul (KR)

( * ) Notice: Subject to any disclaimer, the term of this patent is extended or adjusted under 35 U.S.C. 154(b) by 0 days.

(21) Appl. No.: 13/508,576

(22) PCT Filed: Dec. 23, 2009

(86) PCT No.: PCT/KR2009/007743
§ 371 (c)(1),
(2), (4) Date: May 8, 2012

(87) PCT Pub. No.: WO2011/062320
PCT Pub. Date: May 26, 2011

(65) Prior Publication Data
US 2012/0229022 A1    Sep. 13, 2012

(30) Foreign Application Priority Data
Nov. 19, 2009 (KR) ........................ 10-2009-0111825

(51) Int. Cl.
*H05B 33/26* (2006.01)
(52) U.S. Cl. ........................................ 313/504; 313/332
(58) Field of Classification Search .................... None
See application file for complete search history.

(56) References Cited

U.S. PATENT DOCUMENTS

| | | | |
|---|---|---|---|
| 2005/0052124 A1* | 3/2005 | Hieda et al. | 313/504 |
| 2010/0232090 A1* | 9/2010 | Harada et al. | 361/523 |
| 2011/0051319 A1* | 3/2011 | Ishikawa et al. | 361/523 |

FOREIGN PATENT DOCUMENTS

| | | |
|---|---|---|
| JP | 2007-005257 A | 1/2007 |
| JP | 2007-066709 A | 3/2007 |
| JP | 2008-186618 A | 8/2008 |
| JP | 2008-269893 A | 11/2008 |

* cited by examiner

*Primary Examiner* — Ashok Patel
(74) *Attorney, Agent, or Firm* — Rabin & Berdo, P.C.

(57) ABSTRACT

An OLED device having rear electrodes. The device comprises a substrate whereon a light emitting region is provided, an anode layer wherein an anode terminal is formed on one side of the top of the light emitting region, an organic layer laminated onto the light emitting region of the anode layer, a cathode layer wherein a cathode terminal is formed on one side of the top of the light emitting region, a protective film which seals the light emitting region, a rear electrode for anode of which one side is connected to the anode terminal and the other side is formed from the upper surface of the cathode layer whereon the protective film is provided, and a rear electrode for cathode of which one side is connected to the cathode terminal and the other side formed from the upper surface of the cathode layer whereon the protective film is provided.

5 Claims, 10 Drawing Sheets

OLED DEVICE HAVING REAR ELECTRODES

TECHNICAL FIELD

The present invention relates to an OLED device having rear electrodes, and, more particularly, to an OLED device having rear electrodes formed on a protective film.

BACKGROUND ART

An organic light emitting diode (OLED) is typically configured such that an organic thin film layer, which is an organic light emitting layer, is disposed between an anode layer and a cathode layer on a wafer, and has a very thin matrix form.

Such an organic light emitting diode is advantageous in that it is thin and it can be driven at a low voltage. Further, the organic light emitting diode is advantageous in that it can solve the problems of conventional LCDs, such as a narrow viewing angle, a slow response speed and the like, in that it can produce image quality that is equal to or better than that of different types of displays, particularly, small-size or medium-size displays such as TFT LCDs and the like, and in that it can be manufactured by a simple process. Therefore, the organic light emitting diode is receiving considerable attention as a next-generation flat panel display.

However, an organic light emitting diode used for illumination must emit light uniformly in a large area. Therefore, it is required to make a large-area light emitting device without forming pixels, and the large-area light emitting device may have one or more light emitting regions.

FIG. 1 is a sectional view showing a conventional OLED device.

Referring to FIG. 1, the conventional OLED device includes: a substrate 10; and an anode layer 20, an organic layer 30 and a cathode layer 40 sequentially disposed on the substrate. In the conventional OLED device, when a voltage is applied between the anode layer 20 and the cathode layer 40, an energy difference is induced in the organic layer 30, thus allowing the organic layer to emit light. That is, the excited energy produced by the recombination of electrons and holes injected into the organic layer 30 is converted into light.

Further, the organic layer 30 is weak to moisture and oxygen in the air. Therefore, the conventional OLED device is provided at the uppermost portion thereof with a sealing layer 50 in order to increase the lifespan thereof.

However, the conventional OLED device is problematic in that an anode wire 21 and a cathode wire 41 are drawn out to the lateral side thereof, not the rear side thereof, so an additional wire for connecting the lateral side of the OLED device to a drive system for illumination must be provided in order to use a plurality of OLED devices for illumination, thereby increasing the manufacturing cost thereof.

DISCLOSURE

Technical Object

Accordingly, the present invention has been made to solve the above-mentioned problems, and an object of the present invention is to provide an OLED device having rear electrodes, which is connected to a drive system by an electrode formed on the rear side of a protective film of the OLED device, so an additional wire is not required, thereby reducing the manufacturing cost thereof, and which is aesthetic and can be easily attached and detached because wires are not required due to contact with the drive system.

Technical Solution

In order to accomplish the above objects, an aspect of the present invention provides an OLDE device having rear electrodes, including:

a substrate which is made of a transparent material and which is provided with a light emitting region;

an anode layer which is disposed on the light emitting region of the substrate, and which is provided with one or more anode terminals such that the one or more anode terminals are disposed outside of the light emitting region; an organic layer which is disposed on the light emitting region of the anode layer; a cathode layer which is disposed on the organic layer and which is provided with one or more cathode terminals such that the one or more cathode terminals are disposed outside of the light emitting region; a protective film which seals the anode layer, the organic layer and the cathode layer; a rear electrode for an anode, one side of which is connected to the one or more anode terminals and the other side of which is formed on the protective film; and a rear electrode for a cathode, one side of which is connected to the one or more cathode terminals and the other side of which is formed on the protective film.

The one or more anode terminals may include two anode terminals, the one or more cathode terminals may be disposed between the two anode terminals, and the one or more cathode terminals may be spaced apart from the two anode terminals.

The anode layer may be made of indium tin oxide or indium zinc oxide.

The cathode layer may be made of any one selected from aluminum, copper, silver, lithium fluoride and alloys thereof.

The protective film may be made of glass or a metal, may be encapsulated, and may be passivated.

The anode layer may be provided with anode terminals at one side of the outside of the light emitting region, and the cathode layer may be provided with a cathode terminal at one side of the outside of the light emitting region.

Advantageous Effects

According to the OLED device of the present invention, the OLED device is connected to a drive system by an electrode formed on the rear side of a protective film of the OLED device, so an additional wire is not required, thereby reducing the manufacturing cost thereof. Further, the OLED device is aesthetic and can be easily attached and detached because wires are not required due to contact with the drive system.

Figure 1:
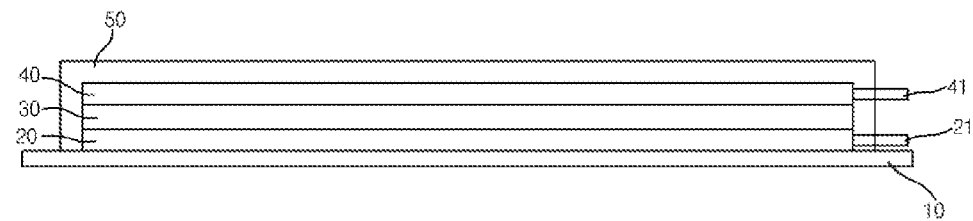
FIG. 1 is a sectional view showing a conventional OLED device.

<Description of the Reference Numerals in the Drawings>

| | |
|---|---|
| 110: substrate | 310: anode layer |
| 311: anode terminal | 410: organic layer |

<Description of the Reference Numerals in the Drawings>

510: cathode layer  515: cathode terminal
610: protective film  910: rear electrode for anode
930: rear electrode for cathode
L: light emitting region

MODE FOR INVENTION

Hereinafter, preferred embodiments of the present invention will be described in detail with reference to the accompanying drawings such that those skilled in the art can easily carry out the present invention.

Figure 2:
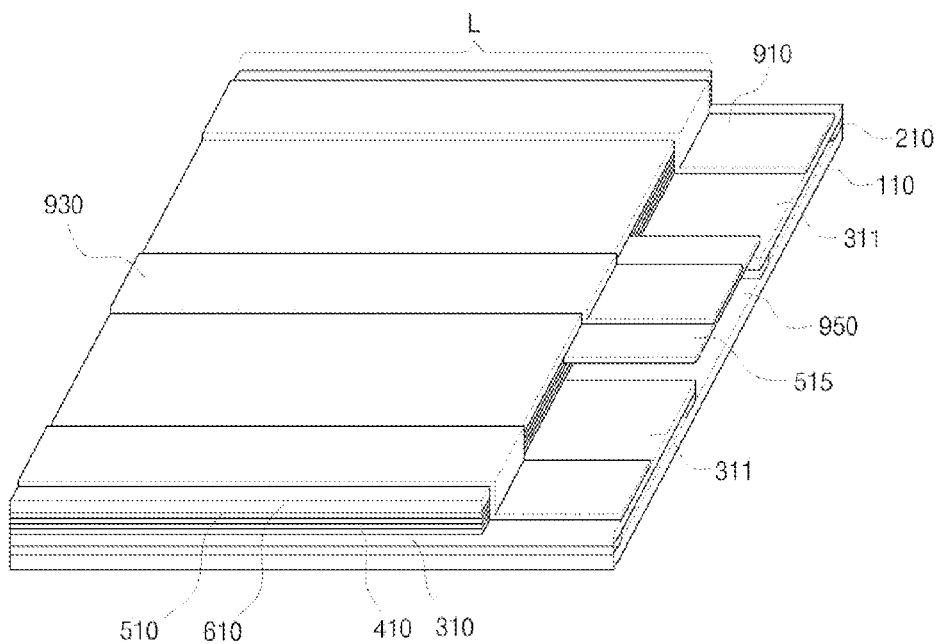
FIG. 2 is a perspective view showing an OLED device according to an embodiment of the present invention.

FIG. 2 is a perspective view showing an OLED device according to an embodiment of the present invention, and FIGS. 3 to 7 are views showing a process of manufacturing an OLED device according to an embodiment of the present invention.

As shown in FIG. 2, the OLED device according to an embodiment of the present invention includes: a substrate 110 provided with a light emitting region (L); grids 210 formed on the substrate 110; an anode layer 310 formed on the grids 210 in the light emitting region (L); one or more anode terminals 311 extended from the anode layer 310; an organic layer 410 formed on the anode layer 310 in the light emitting region (L); a cathode layer 510 formed on the organic layer 410 in the light emitting region (L); one or more cathode terminals 515 extended from the cathode layer 510; and a protective film 610 sealing the light emitting region (L) to allow the protective film 610 to be provided therein with the anode layer 310, the organic layer 410 and the cathode layer 510.

Hereinafter, the process of manufacturing an OLED device according to an embodiment of the present invention will be described in detail with reference to FIGS. 3 to 7.

Figure 3:
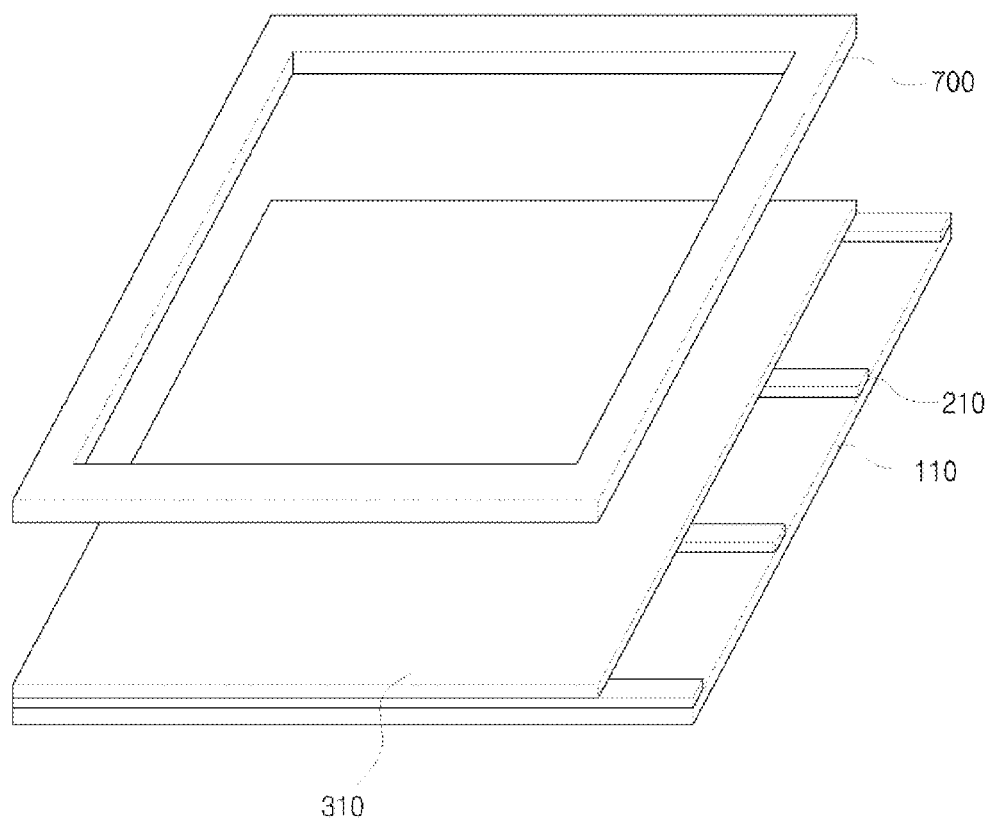
FIGS. 3 to 7 are views showing a process of manufacturing an OLED device according to an embodiment of the present invention.

First, as shown in FIG. 3, grids 210 are formed on a substrate 110 provided with a light emitting region (L).

It is preferred that the substrate 110 be made of glass. The grids 210 come into contact with the following anode layer 310, and serve to decrease the electrical resistance of the anode layer 310 when the anode layer is connected to a wiring part (not shown) of a drive system for illumination. Each of the grids 210 may be made of a metal having lower resistance than that of the anode layer 310, such as chromium (Cr), copper (Cu), molybdenum (Mo), nickel (Ni), aluminum (Al), silver (Ag) or gold (Au). Therefore, light having constant illuminance can be emitted over the entire light emitting region (L).

The grids 210 are formed as follows. First, the above-mentioned metal having low resistance is deposited on the substrate 110, and is then coated with a photoresist. Here, the photoresist is photosensitive, and may be a polyimide (PI) or a polymer resin.

Subsequently, the substrate 110 deposited with the metal coated with the photoresist is exposed to ultraviolet light using a photomask (not shown) to form lines, the lines formed by the photoresist are etched, and then the photoresist is removed from the substrate 110 to form the grids 210.

Subsequently, an anode layer 310 is deposited on the grids 210 by sputtering. The anode layer 310 is deposited using a first mask 700 such that it is deposited only in the light emitting region (L)

The anode layer 310 serves as an anode which is a positive electrode of the OLED device, and may be made of a transparent conductive material having low surface resistance and high transmissivity, such as indium tin oxide (ITO), indium zinc oxide (IZO) or the like.

As such, when the anode layer 310 is formed on the grids 210, the resistance of the anode layer 310 becomes low, so that the power consumption and drive voltage of the OLED device are reduced at the time of connecting the OLED device to an external drive circuit (not shown) and then driving the OLED device, thereby improving the electrical characteristics of the OLED device.

Figure 4:
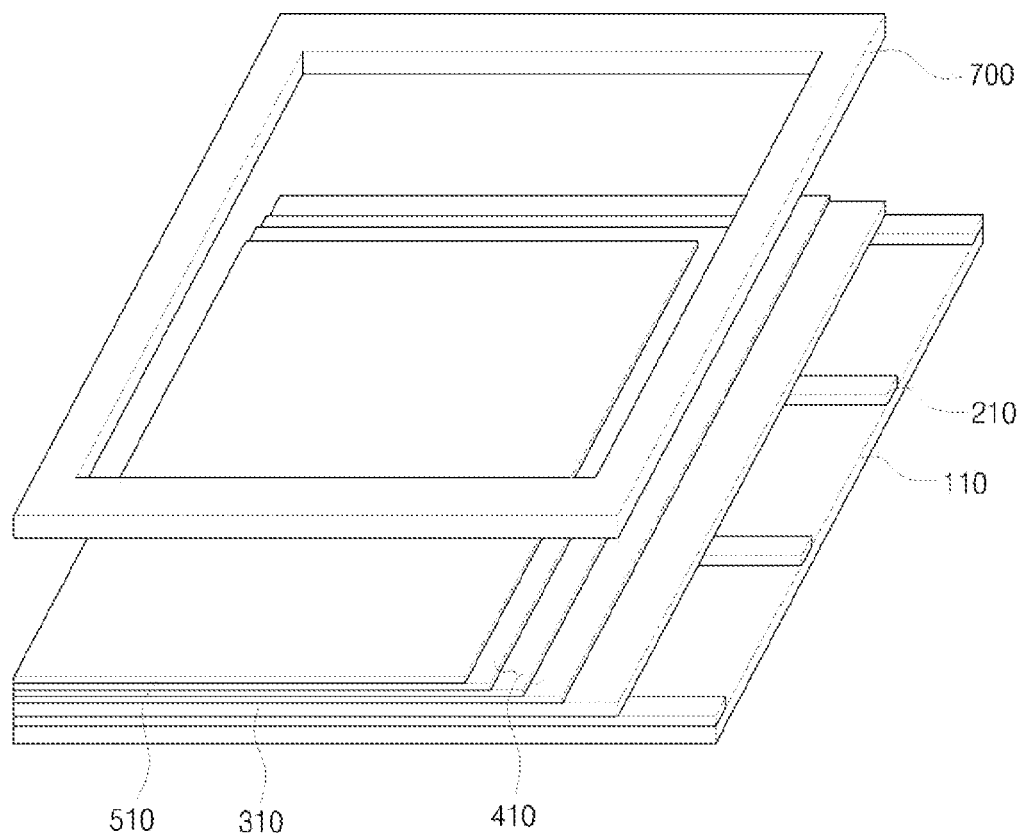
Figure 5:
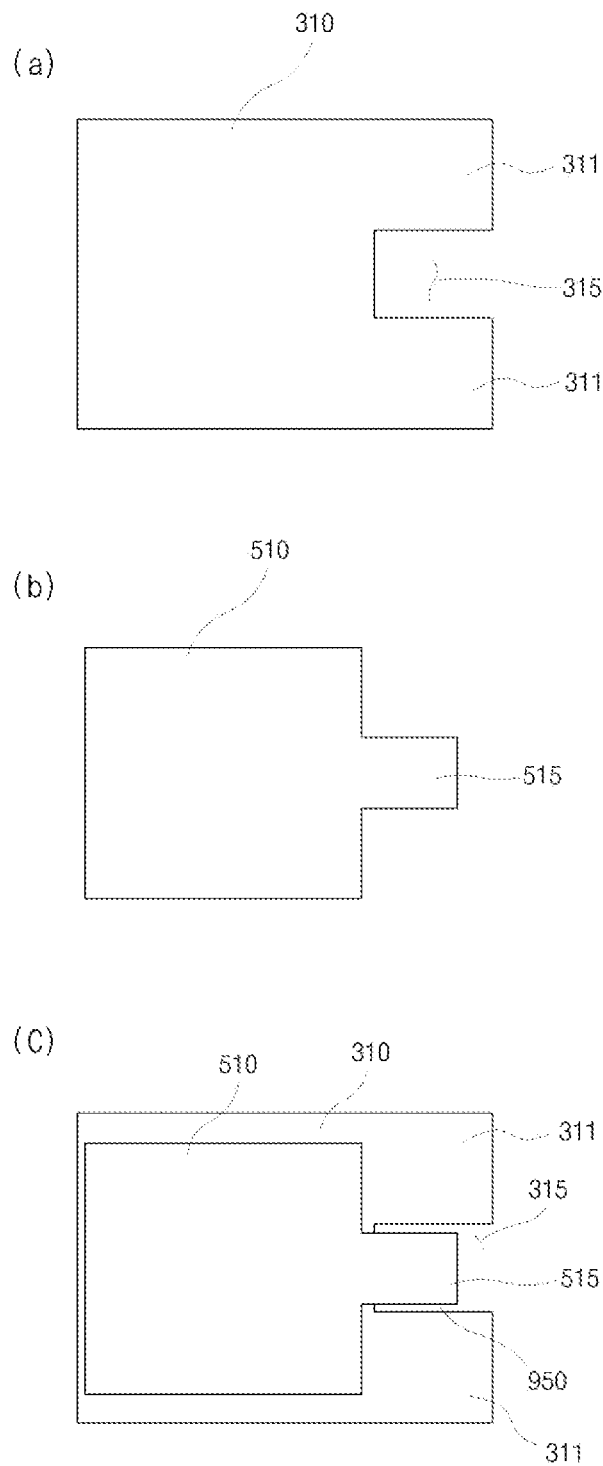

Subsequently, as shown in FIG. 4, an organic layer 410 is deposited on the anode layer 310 in the light emitting region (L) using the first mask 700.

The organic layer 410 is formed on the anode layer 310, and is a light emitting layer of the OLED device. In order to increase the luminance efficiency of the organic layer 410, the organic layer is formed by sequentially depositing a hole injection layer (HIL), a hole transport layer (HTL), an emitting material layer (EML), an electron transfer layer (ETL) and an electron injection layer (EIL).

The organic layer 410 is made of an organic material such as Alq3, TPD, PBD, m-MTDATA, TCTA or the like.

Subsequently, a cathode layer 510 is deposited on the organic layer 410 in the light emitting region (L) using the first mask 700.

The cathode layer 510 may be made of any one selected from aluminum, copper, silver, lithium fluoride (LiF) and alloys thereof.

Here, the anode layer 310 is deposited as shown in FIG. 5A using a mask (not shown) for an anode layer, and the cathode layer 510 is deposited as shown in FIG. 5B using a mask (not shown) for a cathode layer.

Moreover, the anode layer 310 and the cathode layer 510 are provided with two anode terminals 311 and a cathode terminal 515, respectively, such that the anode terminals 311 and the cathode terminal 515 are disposed outside of the light emitting region (L). The two anode terminals 311 are extended from the anode layer 310 with a cut portion 315 disposed therebetween, and the cathode terminal 515 is extended from the cathode layer 510 such that it corresponds to the cut portion 315 which is formed between the anode terminals 311.

Therefore, as shown in FIG. 5C, when the anode layer 310 overlaps with the cathode layer 510, gaps 950 are formed between the cathode terminal 515 and the anode terminals 311 such that the cathode terminal 515 is spaced apart from the anode terminals 311. Therefore, the cathode terminal 515 and the anode terminals 311 are electrically insulated from each other.

Figure 6:
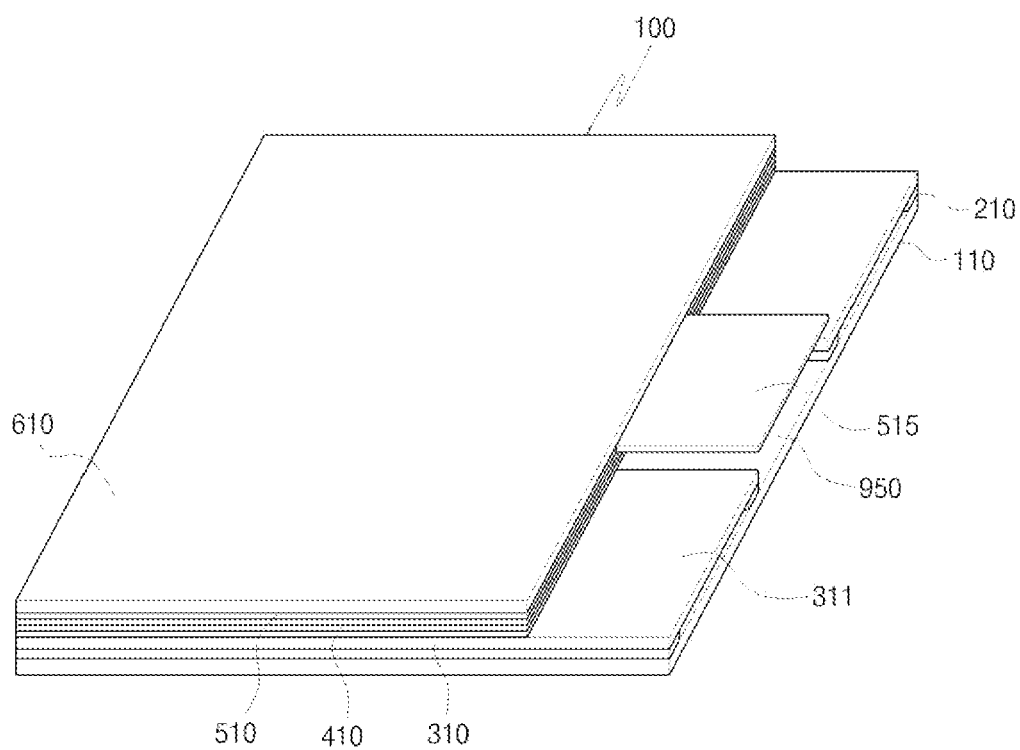

Subsequently, as shown in FIG. 6, a protective film 610 for sealing the light emitting region (L) is formed such that the protective film 610 is provided therein with the anode layer 310, the organic layer 410 and the cathode layer 510.

The protective film 610 serves to encapsulate the organic layer 410 in order to protect the organic layer 420 from moisture or oxygen, and may be made of glass or a metal. The protective film 610 is a thin film, and can be passivated.

Meanwhile, since the protective film 610 seals only the light emitting region (L), the anode terminals 311 and the cathode terminal 515 are drawn out of the protective film 610.

Figure 7:
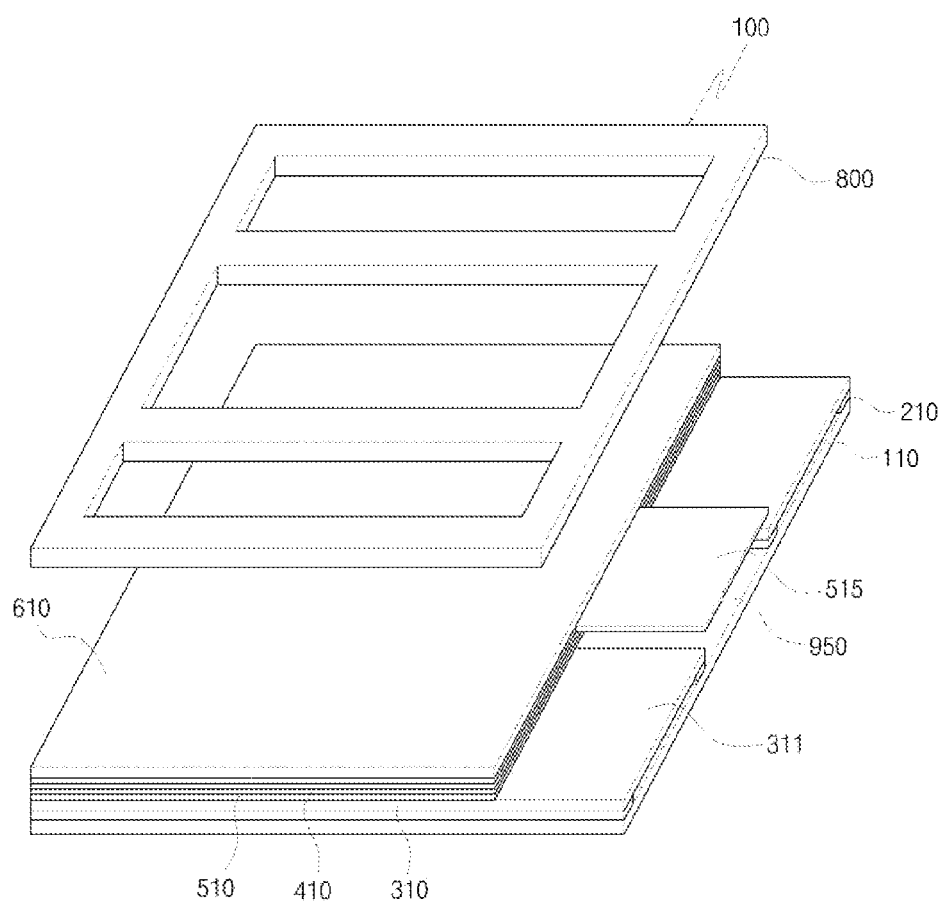

Subsequently, as shown in FIG. 7, a rear electrode 910 for an anode and a rear electrode 930 for a cathode are formed on the protective film 610 by sputtering using the second mask 800.

Therefore, one side of the rear electrode 910 for an anode is connected to the anode terminal 311, and the other side thereof is formed on the upper surface of the protective film 610. Further, one side of the rear electrode 930 for a cathode is connected to the cathode terminal 515, and the other side thereof is formed on the upper surface of the protective film 610.

Here, the rear electrode 910 for an anode and the rear electrode 930 for a cathode correspond to wire patterns connected to a drive circuit for illumination (not shown), and may be formed to such a degree that they can be connected to the drive circuit. Therefore, the other side of each of the rear electrodes 910 and 930 may be formed on a part of the upper surface of the protective film 610 or may be formed in the shape of a band.

When the OLED device manufactured in this way is connected to a drive circuit and then a voltage is applied between the rear electrode 910 for an anode and the rear electrode 930 for a cathode, the organic layer 410 emits light, and the emitted light is irradiated to the outside through the substrate 110, and thus the OLED device is used for illumination.

Figure 8:
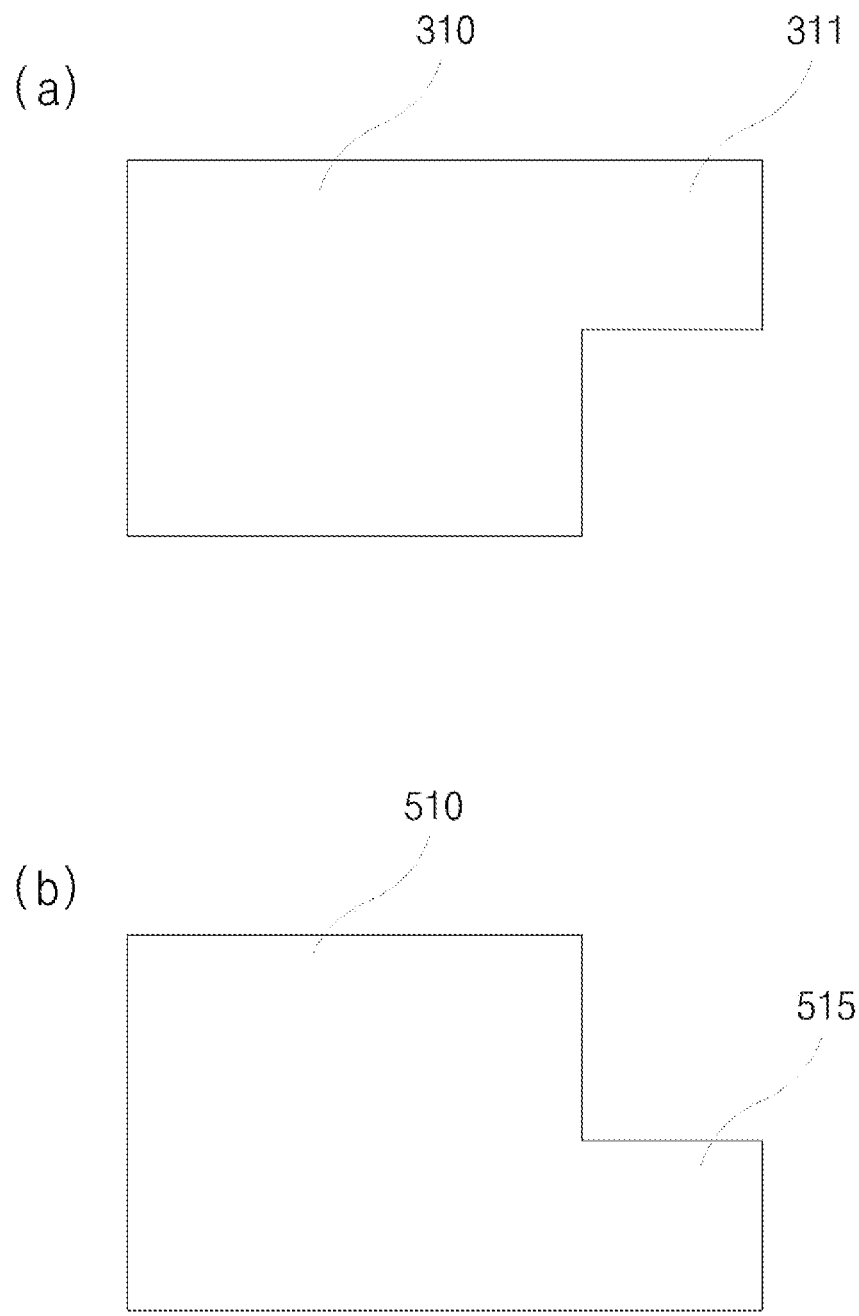
FIGS. 8 and 9 are views showing an OLED device according to another embodiment of the present invention.
Figure 9:
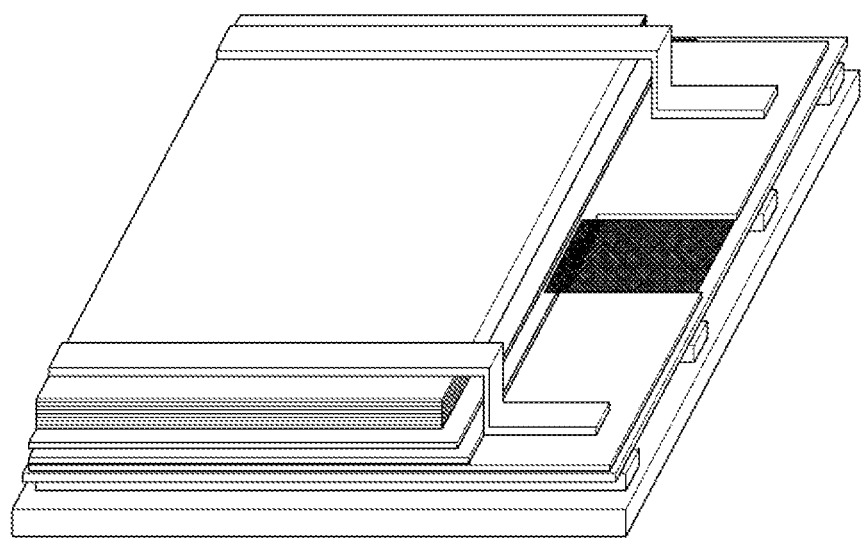
Figure 10:
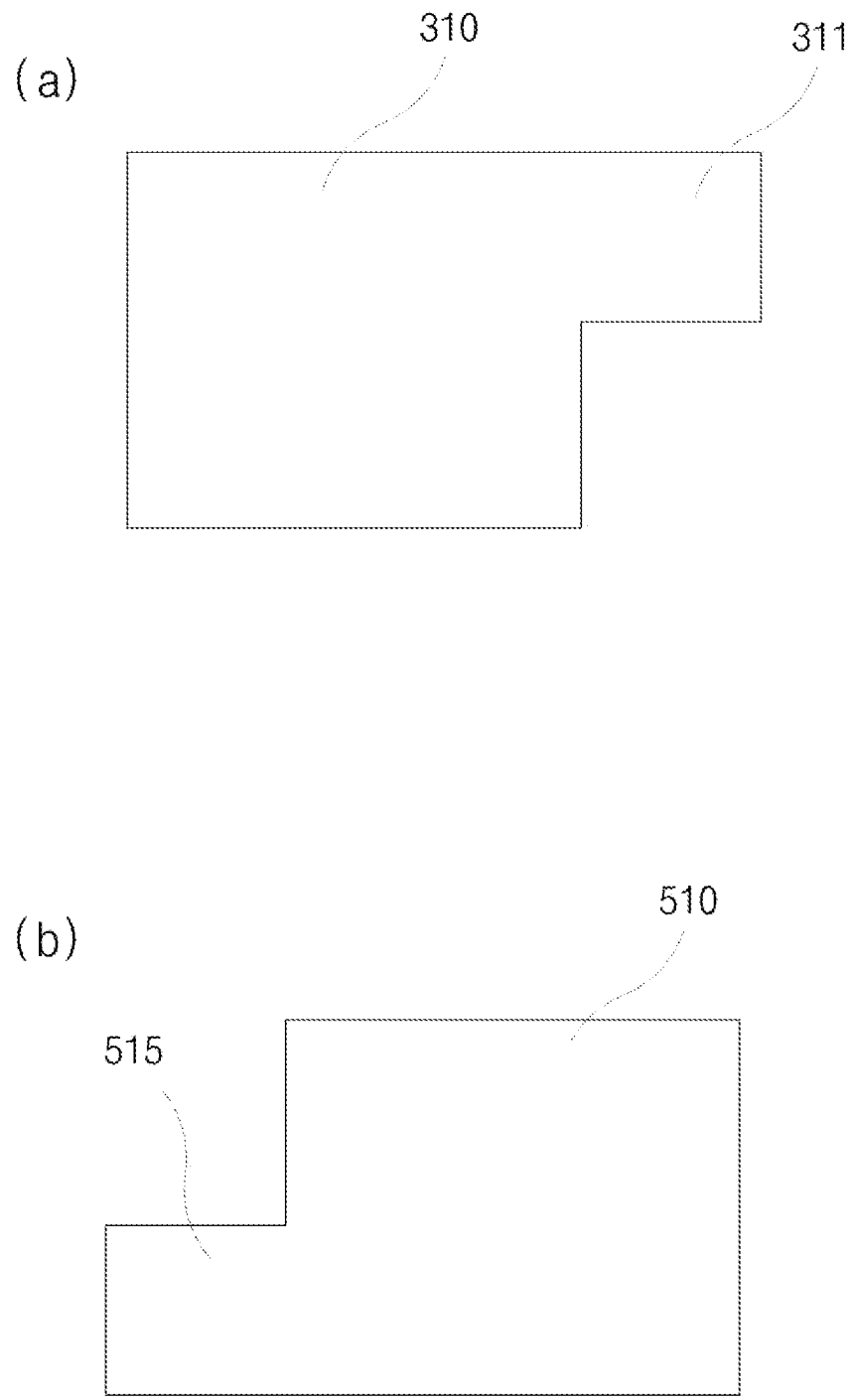
FIGS. 10 and 11 are views showing an OLED device according to still another embodiment of the present invention.
Figure 11:
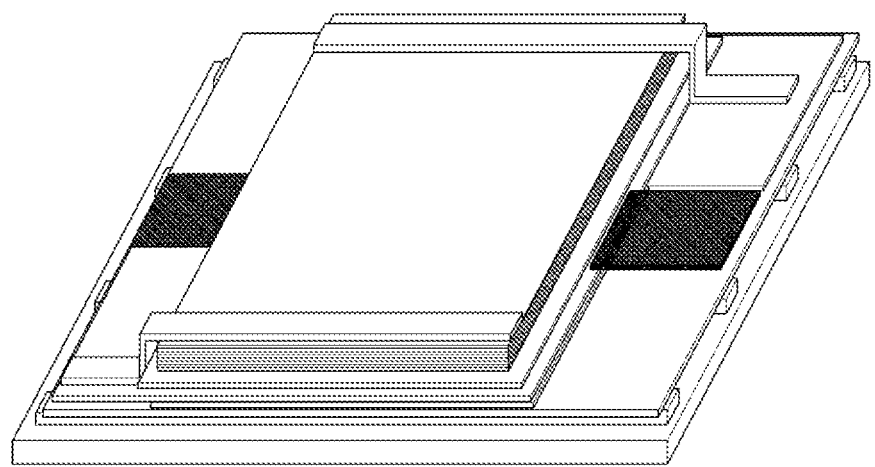

FIGS. 8 and 9 are views showing an OLED device according to another embodiment of the present invention, and FIGS. 10 and 11 are views showing an OLED device according to still another embodiment of the present invention.

In the OLED device according to another embodiment of the present invention, as shown in FIG. 8A, an anode layer 310 is provided with one anode terminal 311 formed at the outside of the light emitting region (L), and, as shown in FIG. 8B, a cathode layer 510 is provided with one cathode terminal 515 formed at the outside of the light emitting region (L).

Therefore, as shown in FIG. 9, the OLED device according to this embodiment is provided with one rear electrode for an anode and one rear electrode for a cathode.

Further, in the OLED device according to still another embodiment of the present invention, as shown in FIG. 10A, an anode layer 310 is provided with one anode terminal 311 formed from one side of the anode layer 310 to the outside of the light emitting region (L), and, as shown in FIG. 10B, a cathode layer 510 is provided with one cathode terminal 515 formed from the other side of the cathode layer 510 to the outside of the light emitting region (L).

Therefore, as shown in FIG. 11, the OLED device according to this embodiment is provided with one rear electrode for an anode and one rear electrode for a cathode formed in opposite directions to each other.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An OLED device having rear electrodes, comprising:
a substrate made of a transparent material, the substrate being provided with a light emitting region;
an anode layer disposed on the light emitting region of the substrate;
one or more anode terminals disposed outside of the light emitting region, the one or more anode terminals being extended from the anode layer;
an organic layer disposed on the anode layer;
a cathode layer disposed on the organic layer;
one or more cathode terminals disposed outside of the light emitting region, the one or more cathode terminals being extended from the cathode layer;
a protective film sealing the anode layer, the organic layer and the cathode layer;
a rear electrode for an anode connected to the one or more anode terminals, the rear electrode for an anode being formed on the protective film; and
a rear electrode for an cathode connected to the one or more cathode terminals, the rear electrode for an cathode being formed on the protective film.

2. The OLED device of claim 1, wherein the one or more anode terminals comprise two anode terminals, the one or more cathode terminals are disposed between the two anode terminals, and the one or more cathode terminals are spaced apart from the two anode terminals.

3. The OLED device of claim 1, wherein the anode layer is made of indium tin oxide or indium zinc oxide.

4. The OLED device of claim 1, wherein the cathode layer is made of any one selected from aluminum, copper, silver, lithium fluoride and alloys thereof.

5. The OLED device of claim 1, wherein the protective film is made of glass or a metal.

* * * * *